United States Patent
Jin et al.

[11] Patent Number: 6,149,778
[45] Date of Patent: Nov. 21, 2000

[54] ARTICLE COMPRISING FLUORINATED AMORPHOUS CARBON AND METHOD FOR FABRICATING ARTICLE

[75] Inventors: Sungho Jin, Millington; Ruichen Liu, Warren; Chien-Shing Pai, Bridgewater; Wei Zhu, Warren, all of N.J.

[73] Assignee: Lucent Technologies Inc., Murray Hill, N.J.

[21] Appl. No.: 09/196,486

[22] Filed: Nov. 19, 1998

Related U.S. Application Data

[60] Continuation-in-part of application No. 09/127,541, Jul. 31, 1998, abandoned, which is a division of application No. 09/049,256, Mar. 27, 1998.
[60] Provisional application No. 06/077,757, Mar. 12, 1998.

[51] Int. Cl.⁷ ..................................................... C23C 14/34
[52] U.S. Cl. ............................. 204/192.22; 204/192.12; 204/192.11; 204/192.15; 204/192.16; 204/192.2
[58] Field of Search ........................ 204/192.12, 192.15, 204/192.16, 192.2, 192.11, 192.22

[56] References Cited

U.S. PATENT DOCUMENTS

| | | | |
|---|---|---|---|
| 3,767,559 | 10/1973 | Agnone et al. | 204/298.14 |
| 4,629,547 | 12/1986 | Honda et al. | 204/192.16 |
| 4,824,724 | 4/1989 | Ueda et al. | 204/192.2 |
| 4,933,058 | 6/1990 | Bache et al. | 204/192.16 |
| 5,266,524 | 11/1993 | Wolters | 204/192.12 |

FOREIGN PATENT DOCUMENTS 2203758  10/1988  United Kingdom .............. 204/192.16

OTHER PUBLICATIONS

Endo, K. et al., *J. Appl. Phys.*, 78, 1370 (1995).
Matsubara, Y. et al., *IEEE IEDM*, p. 14.6.1 (1997).
Grill, A. et al., *Mat. Res. Soc. Symp. Proc.*, vol. 443, p. 155 (1997).
Endo, K. et al., *Appl. Phys. Lett.* 68, 2864 (1996).
Harper, J. et al., "Ion Beam Deposition", *Thin Film Processes*, Ch. 11–5 (1978).

*Primary Examiner*—Rodney McDonald
*Attorney, Agent, or Firm*—Scott J. Rittman

[57] ABSTRACT

The invention provides a device containing a low κ, hydrogen-free a-C:F layer with good adhesion and thermal stability. It was found that the combination of desirable properties was attainable by a relatively easy process, as compared to processes that utilize gaseous sources, such as CVD. Specifically, the a-C:F layer is formed by sputter deposition, using only solid sources for the fluorine and carbon, and in the absence of any intentionally-added hydrogen-containing source. The sputtering is performed such that the layer contains 20 to 60 at. % fluorine, and also, advantageously, such that the a-C:F exhibits a bandgap of about 2.0 eV or greater. The a-C:F layer formed by the process of the invention exhibits a dielectric constant, at 1 MHz and room temperature, of 3.0 or less, advantageously 2.5 or less, along with being thermally stable up to at least 350° C., advantageously 450° C., and exhibiting a stress of about 100 MPa or less, in absolute value.

32 Claims, 5 Drawing Sheets

ARTICLE COMPRISING FLUORINATED AMORPHOUS CARBON AND METHOD FOR FABRICATING ARTICLE

CROSS-REFERENCE TO RELATED APPLICATIONS

This application is a continuation-in-part of application Ser. No. 09/127541, filed on Jul. 31, 1998 now abandoned, which is a divisional of application Ser. No. 09/049256, filed on Mar. 27, 1998, which claims priority of Provisional Application Ser. No. 60/077757, filed Mar. 12, 1998.

BACKGROUND OF THE INVENTION

1. Field of the Invention

This invention pertains to low dielectric constant materials, and, in particular, to fluorinated amorphous carbon.

2. Discussion of the Related Art

As device integration densities rise and circuit dimensions shrink, certain problems are encountered. For example, the smaller line dimensions increase the resistivity of the metal lines, and the narrower interline spacing increases the capacitance between the lines. This increased resistance and capacitance causes problems in propagation delay, crosstalk noise, and power dissipation. Moreover, as the device speed increases due to smaller feature sizes, the resistance-capacitance (RC) delay caused by the increased resistivity and capacitance will tend to be the major fraction of the total delay (transistor delay+interconnect delay) limiting the overall chip performance. It is therefore desirable to reduce the increased resistance and capacitance in integrated circuit applications.

To address these problems, new materials for use as metal lines and interlayer dielectrics (ILD), as well as alternative architectures, have been proposed to replace the current $SiO_2$-based interconnect technology. These alternative architectures will require the introduction of low dielectric constant ($\kappa<3$) materials as the interlayer dielectric and/or low resistivity conductors such as copper.

To implement low $\kappa$ materials to replace $SiO_2$, two basic approaches are being developed for future interconnect architectures. The first is to improve the current process, in which metal wiring is first patterned, and then a low-$\kappa$ dielectric material is either (a) deposited over the entire substrate and planarized to the level of the metal wiring or (b) deposited directly next to the patterned lines.

The second approach is based on the damascene process, in which the metal is deposited into wiring channels patterned into a dielectric material. The damascene process is particularly well-suited for implementation of Cu metallization. A typical damascene process is reflected in FIGS. 1A–1C. Insulating layer 12 is deposited onto a previously deposited insulating substrate 10. As reflected in FIG. 1A, a photoresistive pattern 14 is formed on the insulating layer 12, and openings are then etched in the insulating layer 12. As shown in FIG. 1B, a conductive metal 16, e.g., aluminum, is then deposited in the trenches to form wiring, generally by sputtering or chemical vapor deposition. The deposited metal 16 is planarized down to the level of the insulating layer 12 to form delineated wiring, and the steps are repeated, as reflected in FIG. 1C to form a multilayer structure, with vias 18 connecting the wiring 16. A so-called dual damascene process also exists. As reflected in FIGS. 2A–2C, the dual damascene process involves the simultaneous formation of a conductive via and a conductive wiring, and thus requires less steps than a single damascene process. Specifically, as shown in FIG. 2A, an insulating layer 22 is deposited on a previously deposited insulating substrate 20, and is then patterned by conventional photolithographic methods to form first openings 24 that are the intended width of the via. As shown in FIG. 2B, a photoresist layer 26 is then deposited to form second openings 28 that are the intended width of the wiring trench. Etching, typically reactive ion etching (RIE), is conducted to form the via and wiring trenches. As shown in FIG. 2C, a conductive metal 32 is then deposited by a method such as sputtering or chemical vapor deposition to simultaneously form the vias and wiring.

It is desired that new low $\kappa$ materials exhibit a variety of electrical, chemical, mechanical and thermal properties. These properties include low dielectric constant, high thermal stability, good adhesion, low stress, good mechanical strength, matched CTE (coefficient-of-thermal-expansion) with silicon, etchability and etch selectivity, low moisture absorption, high thermal conductivity, low leakage current, high breakdown strength, and manufacturability.

A variety of low $\kappa$ materials have been proposed to meet some or all of these criteria. The materials are typically produced by chemical vapor deposition (CVD) or by spin-on coating. Materials produced by CVD include fluorinated $SiO_2$ glass ($\kappa=3.5$), fluorinated amorphous carbon, and polymers such as the parylene and polynaphthalene families, and polytetrafluoroethylene (PTFE) ($\kappa=2.7-3.5$ for nonfluorinated polymers and 1.8–3.0 for fluorinated polymers). (Amorphpous carbon indicates a material having a mixture of $sp^1$, $sp^2$, and $sp^3$ bonded carbon, i.e., a mixture of carbyne, graphite, and diamond structures, respectively, in which no more than 10% of the carbon bonds are $sp^3$) Materials deposited by spin-on coating include organic polymers, inorganic polymers, inorganic-organic hybrids, and porous materials such as xerogels or aerogels. Organic materials typically offer lower dielectric constants than inorganic materials but exhibit disadvantageous properties such as low thermal stability, low mechanical strength, low resistance to oxygen plasma, and poor adhesion, and also tend to cause via poisoning (i.e., detrimentally affect the reliability of the conductive vias).

Fluorinated amorphous carbon (a-C:F) has attracted particular attention recently as a promising candidate for low $\kappa$ ILD material. Amorphous C:F layers deposited by chemical vapor deposition techniques, using source compounds of hydrocarbons (such as $CH_4$, $C_2H_2$) and fluorocarbons (such as $CF_4$, $C_2F_6$, $C_4F_8$), have exhibited useful dielectric constants. In particular, a-C:F layers with a dielectric constants of 2.1 to 2.3 have been deposited with both parallel-plate plasma enhanced CVD and high density plasma (HDP) CVD. (See K. Endo and T. Tatsumi, *J. Appl. Phys.*, 78, 1370 (1995); Y. Matsubara et al., *IEEE IEDM* 1996, p. 14.6.1; A. Grill et al., *Mat. Res. Soc. Symp. Proc.*, Vol. 443, p. 155 (1997); and K. Endo and T. Tatsumi, *Appl. Phys. Lett.* 68, 2864 (1996).)

While the CVD process offers useful results, the process disadvantageously involves complicated chemistries, i.e., chemical reactions of different species, requires elevated temperatures to provide appropriate energy and kinetics for the chemical reactions, and is prone to impurity and particle contamination caused by gas phase reactions. Moreover, the a-C:F layers produced by CVD exhibit poor adhesion on $SiO_2$, and therefore require an additional buffer layer to promote adhesion. The need for such a buffer layer results in higher manufacturing cost and more complications in device processing and operation. CVD a-C:F layers also contain hydrogen impurities due to the use of hydrocarbon sources (e.g., $CH_4$, $C_2H_2$). Such hydrogen impurities tend to degrade the usefulness of the resultant material by reducing the thermal stability, due to disruption of the C—C crosslinking structure and the relative weakness of the C—H bond. An attempt at a partial solution to these CVD-related problems is reflected in T. Amano et al., "Preparation of fluorinated amorphous carbon (a-C:F) by magnetron sputtering," 58th Conference on Applied Physics of Japan, 1997. The authors describe an essentially hybrid CVD/sputtering approach (reactive sputtering) in which a $CF_4$ gas source and a solid carbon source are used to form the a-C:F layer. Such an approach addresses problems created by hydrogen impurities, but does not appear to address the other problems encountered with CVD processes.

Thus, a-C:F layers are desired which exhibit low dielectric constant along with other required properties, and which are capable of being formed from processes more controllable than previous methods.

SUMMARY OF THE INVENTION

According to the invention, an a-C:F layer of an article is formed by sputter deposition, or sputtering, using solid sources for both the fluorine and carbon, and in the absence of any intentionally-added gaseous fluorine-containing source, gaseous carbon-containing source, or gaseous hydrogen-containing source. (As used herein, a-C:F indicates no more than 10% of the carbon-carbon bonds are $sp^3$ bonds. Sputter deposition indicates a process in which the atoms of a source, or target, material are physically displaced by ions, e.g., from a plasma or an ion beam, such that the displaced source atoms are deposited onto a substrate, forming a layer.) The invention therefore provides an article containing a low κ, a-C:F layer with good adhesion and thermal stability, having less than 10 atomic percent hydrogen, advantageously less than 5 atomic percent, more advantageously less than 1 at. %. (Layer indicates that the material is present as a continuous or discontinuous layer in a device. Thermally stable at a given temperature indicates that the material will exhibit less than 5 wt. % loss after 10 minutes of exposure at that temperature.)

It was found that a combination of desirable properties, including low dielectric constant, was attainable by sputter deposition, which is easier and more straightforward than processes such as CVD and reactive sputtering that utilize gaseous sources and rely on chemical reactions. For example, in the invention, the use of toxic and corrosive fluorine-containing gases is avoided, thereby eliminating the need for complicated gas phase plasma chemistry and safety measures. Similarly, no hydrogen-containing gaseous sources are needed, thereby allowing improved thermal stability. In addition, gaseous sources typically require high temperatures to excite and activate the gas, whereas the invention is capable of being performed near room temperature. Moreover, the invention's reduced operating pressure (versus CVD) reduces the likelihood of particle or impurity contamination by substantially reducing gas phase reactions.

The sputtering process of the invention is capable of being performed with separate carbon and fluorine sources or with a single source containing both. In the former case, for example, it is possible to use graphite as a carbon source and polytetrafluoroethylene (PTFE) (typically Teflon®) as a fluorine source. In the latter case, reflected in FIG. 4, a single source containing both carbon and fluorine, e.g., a fluoropolymer such as PTFE, is used. The sputtering conditions and target composition are selected such that the layer contains a desired amount of fluorine, typically about 20 to about 60 at. % fluorine, advantageously 30 to 50 at. %. This range of fluorine allows attainment of a desirable combination of layer properties. In particular, it is possible for an a-C:F layer formed by the process of the invention to exhibit a dielectric constant, at 1 MHz and room temperature (i.e., about 25 to about 30° C.), of 3.0 or less, advantageously 2.5 or less, along with being thermally stable up to at least 350° C., advantageously 450° C. It has also been found that a relatively low stress of about 100 MPa (in absolute value) or less is possible according to the invention (which improves adhesion, without a buffer layer, to a variety of substrate materials, including Si, $SiO_2$, TiN and Al). (The stress is determined by measuring the effect of the deposited layer on the curvature of a substrate, and is either compressive or tensile.) In addition, an advantageous bandgap greater than 2.0 eV contributes to desirable breakdown field, e.g., about 1 MV/cm or greater, and desirable leakage current, e.g., about 1 $nA/mm^2$ or less.

The invention is useful in devices, as illustrated in FIG. 8, which shows a partial device structure. The structure contains amorphous fluorinated carbon layers 81, 83 (optionally, layers 80, 82 are also formed from a-C:F, or another dielectric material such as $SiO_2$), in which are located windows 76, wiring 77, 79 and vias 78. The structure also contains field oxides 70, 71, a source 72 and drain 73, and gates 74, 75.

The invention therefore provides an improved process for preparing a device containing an amorphous fluorinated carbon layer, where the layer exhibits a variety of properties important to good device performance, including low dielectric constant, high thermal stability, low stress, high breakdown field, and low leakage current.

DETAILED DESCRIPTION

In one embodiment of the invention, a plasma is generated by applying either a dc (direct current) or rf (radio frequency) or microwave electric field between a cathode (the source/target) and an anode (the substrate), and introducing an inert gas such as Ar (typically at a pressure of 0.5 to 100 mtorr). The charged ions in the Ar plasma hit the target surface, and as a result of momentum transfer, one or more atoms from the target surface are ejected (i.e., are sputtered from the target surface). The ejected atoms, acting on the transferred momentum, subsequently travel through the plasma and deposit on the substrate, which is typically rotated to improve uniformity. The sputtering thus occurs essentially along a line-of-sight path. To achieve a desirable deposition rate, the sputtering is often operated in a magnetron mode where a magnetic field is used to trap the electrons near the cathode surface and thus increase the ionization efficiency and plasma density. The magnetic field is typically formed by placing permanent magnets (e.g., rare earth-cobalt or neodymium-iron-boron) behind the target to enhance the plasma density and sputtering rate.

Figure 1A:
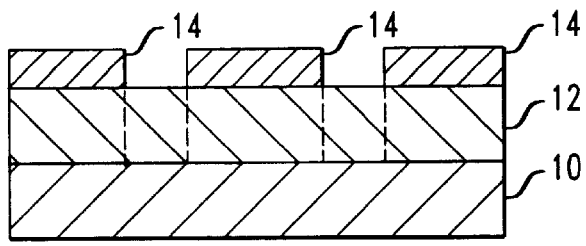
FIGS. 1A–1C illustrate a damascene process.
Figure 1B:
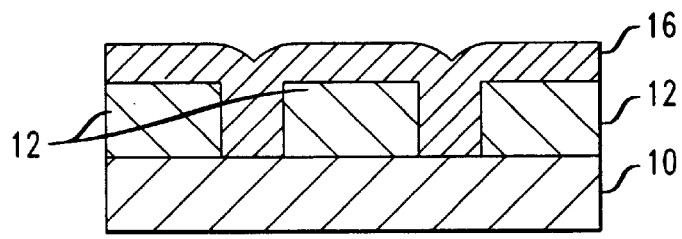
Figure 1C:
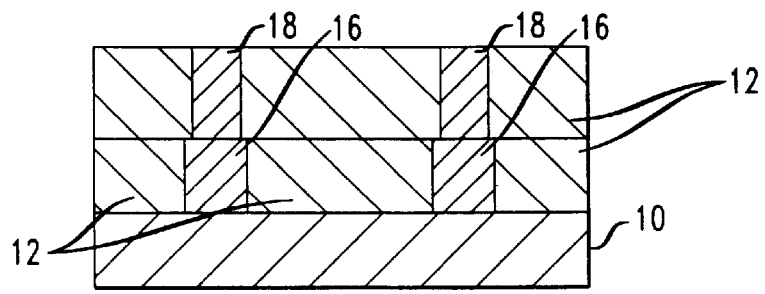
Figure 2A:
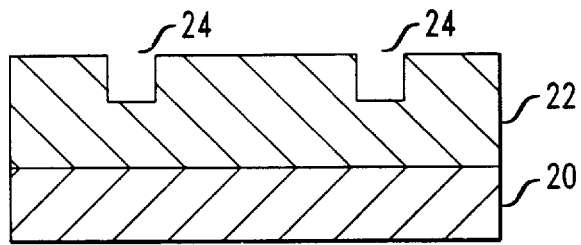
FIGS. 2A–2C illustrate a dual damascene process.
Figure 2B:
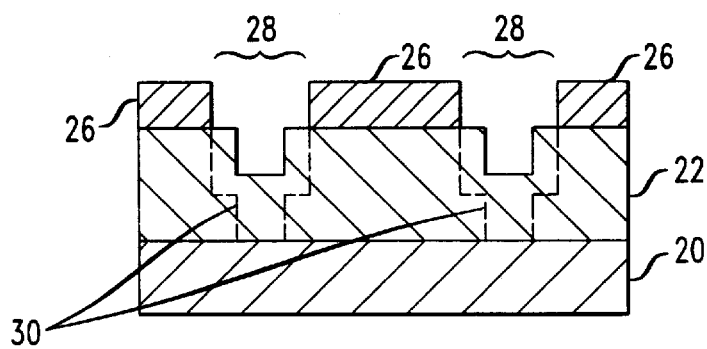
Figure 2C:
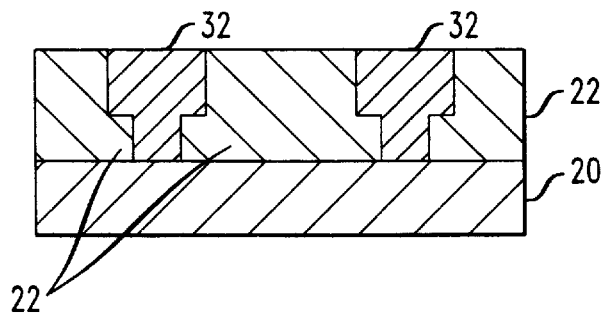
Figure 3:
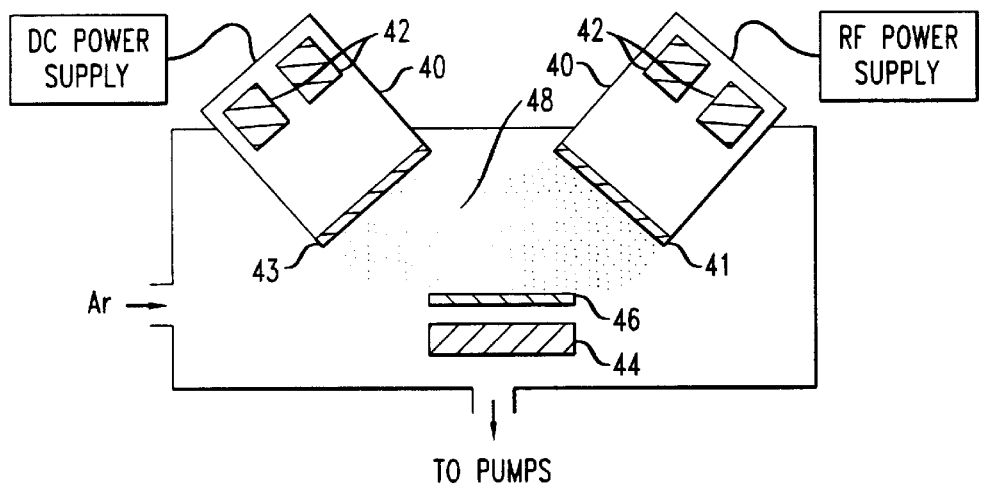
FIG. 3 is a schematic diagram of a sputtering apparatus utilizing separate carbon-containing and fluorine-containing sources.

FIG. 3 reflects a magnetron sputtering apparatus utilizing a solid carbon-containing target 43 and a solid fluorine-containing target 41 on separate cathodes 40. Magnets 42 are used, as discussed previously, to trap electrons near the cathode surface. The cathode 40 with the carbon-containing target 43 is attached to a dc or rf power supply, while the cathode 40 with the fluorine-containing target 41 is attached to an rf power supply. A substrate 46 is provided, and acts as an anode. A heating or cooling stage 44 is typically provided below the substrate 46 for temperature control. As discussed previously, the charged ions in the Ar plasma 48 hit the surfaces of the targets 41, 43, and as a result of momentum transfer, one or more atoms from the targets 41, 43 surfaces are ejected. The ejected atoms travel through the plasma 48 and deposit on the substrate 46.

The carbon-containing target 43 is typically formed from graphite, while the fluorine-containing target 41 is typically formed from a fluoropolymer such as PTFE. The carbon target 43 is capable of being operated in either a dc or rf mode. The fluoropolymer 41, because it is typically an electrically insulating material, generally requires the use of an rf field to avoid substantial charge build-up. Typically, both targets 41, 43 are thermally bonded to the backing cathodes 40, which act as heat sinks to cool the targets 41, 43. Such thermal contact between the targets 41, 43 and the cathodes 40 is particularly important when relatively high power is used for achieving high deposition rate, and also where the target has relatively low melting temperatures and relatively poor thermal conductivity (both of which are true for a fluoropolymer target).

During sputtering, it is possible to apply relatively high power (>1 kW) to a carbon target. However, the power level for a fluoropolymer target is typically limited to less than about 1 kW to avoid overheating. It is possible to adjust the relative power levels applied to both targets to change the fluorine concentration in the deposited layers over a relatively wide range (e.g., 20 to 60 at. % fluorine). (Increasing power to a target increases the sputtering from that target, and thus increases the concentration of that target's material in the sputtered layer.) This ability to manipulate fluorine concentration over such a wide range is a significant advantage over processes utilizing gaseous sources, such as CVD. In such processes, a change in gaseous source compounds is often required to adjust the fluorine concentration (i.e. from $CF_4$ to $C_2F_6$ to $C_4F_8$), and the range of such adjustment is often limited. In addition to adjusting the power level in the process of the invention, it is possible to influence the incorporation of fluorine by changing the substrate temperature during the sputtering process, because fluorine desorbs relatively easily at elevated temperatures.

Figure 4:
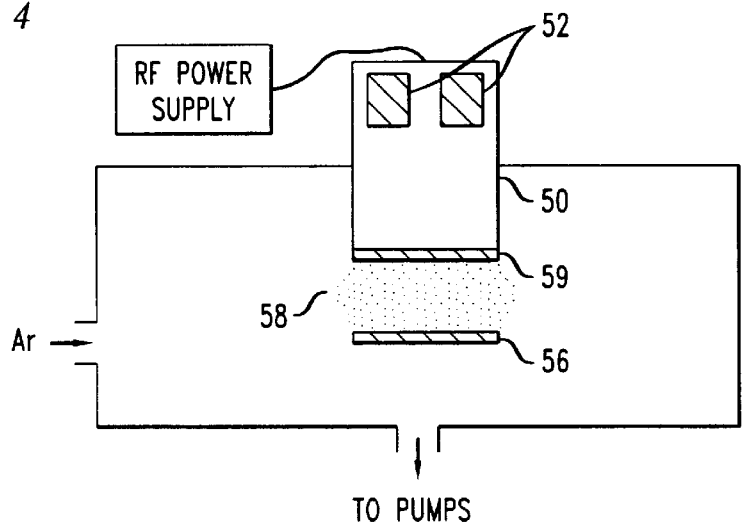
FIG. 4 is a schematic diagram of a sputtering apparatus utilizing a single carbon- and fluorine-containing source.

FIG. 4 illustrates a sputtering process using a single carbon- and fluorine-containing target 59 attached to a cathode 50. Magnets 52 provide a magnetron sputtering mode. As discussed previously, charged ions in the Ar plasma 58 dislodge carbon and fluorine atoms from the target 59, these atoms depositing onto the substrate 56. The single target 59 is typically a fluoropolymer such as PTFE.

Such a fluoropolymer target provides both carbon and fluorine atoms without the need for other target materials or reactive gases. As in the previous embodiment, the power level for a fluoropolymer target is typically limited to less than about 1 kW to avoid overheating the target Relatively low Ar pressure (<10 mtorr) is typically used to achieve a reasonably high deposition rate. The low operating pressure also helps to avoid gas phase reactions and associated particle generation. To further increase the growth rate, it is possible to use heavier noble gases than Ar, such as Kr or Xe, as the sputtering gas. Addition of $N_2$ has also been found to be useful for increasing the deposition rate. It is possible to apply a bias (dc or rf) to the substrate to enhance the impact of the source atoms onto the substrate, thereby improving the film structure, as discussed in more detail below.

The value of the dielectric constant relates to the polarizability of a material and is therefore strongly dependent on the chemical structure. It is believed that fluorine substitution into an otherwise pure carbon or hydrocarbon structure lowers κ by decreasing the polarizability and moisture absorption and increasing the free volume. Specifically, the formation of C—F bonds is believed to decrease the electronic polarizability due to fluorine's strong electron-withdrawing inductive effects. Thus, the higher the fluorine concentration, the lower the dielectric constant. The low-hydrogen a-C:F layers produced by the above process of the invention have dielectric constant values, at 1 MHz and room temperature, of 3.0 or less, advantageously 2.5 or less.

The substantial absence of hydrogen is also significant to the properties of the a-C:F layer of the invention. Specifically, hydrogen detrimentally affects both the mechanical strength and thermal stability of the layers by suppressing C—C crosslinking bonds and forming relatively weak C—H bonds (as compared to C—F bonds). The a-C:F layers of the invention typically contain less than 10 atomic percent hydrogen, advantageously less than 5 at. %, and more advantageously less than 1 at. %.

With such a low concentration of hydrogen, the process of the invention allows attainment of desired thermal stability of up to at least 350° C., advantageously at least 400° C., more advantageously 450° C. Such thermal stability values are desired to improve the a-C:F layer's endurance of a typical device integration process. As discussed previously, the higher the fluorine concentration, the lower the dielectric constant. However, too high a fluorine concentration will lower the material's thermal stability, because excessive fluorine atoms decrease the amount of the strong, C—C crosslinked network and result in, it is believed, an undesirable amount of volatile, small molecular weight F—C species, both of which make the material less useful. A balance between dielectric constant and thermal stability must therefore be made for most applications. In addition, a bandgap in the amorphous fluorinated carbon material greater than 2.0 eV is desirable, this bandgap achievable due the presence of $sp^3$ bonding in the material. This relatively high bandgap will tend to provide a material with a desirably high breakdown field, e.g., about 1 MV/cm or higher, and a desirably low leakage current, e.g., about 1 $nA/mm^2$ or less.

The above process of the invention is also capable of forming an a-C:F layer exhibiting a relatively low stress of about 100 MPa or less, in absolute value (as measured by laser scanning of the wafer curvature before and after formation of the a-C:F layer, according to conventional techniques). Low stress improves adhesion, e.g., to substrates such as Si, $SiO_2$, Al, TiN, and glass, by reducing the tendency of a layer to delaminate from such substrates. As the fluorine concentration is increased, the stress decreases (thereby improving adhesion). It has been found that particularly low stresses are obtained at about 40 at. % fluorine or higher in the sputtered layers formed according to the invention. In addition to fluorine concentration, adjusting the power to the target or targets will tend to change the stress state, due to the power's effect on deposition rate. The thickness of a-C:F layers in a device is typically in the range of 0.2–1 µm, more typically 0.4–0.7 µm.

Introducing porosity into the amorphous fluorinated carbon layer also contributes to lower dielectric constant. Specifically, increased porosity assists in lowering the dielectric constant by introducing air, which has a dielectric constant of about 1. Optionally, the a-C:F layer is provided with a porosity of about 10 vol. % or greater, possibly even 20 vol. % or greater. The average pore size, as measured by conventional techniques such as electron microscopy, in a layer having enhanced porosity (i.e., about 10 vol. % or greater porosity) is typically no more than 30 nm, advantageously no more than 10 nm. The dielectric constant in an enhanced-porosity layer is typically at least 5% lower, advantageously at least 15% lower, than a porosity-free a-C:F layer (i.e., with less than 3 vol. % porosity). It is possible to modify the sputtering process discussed previously to obtain such porosity. In one embodiment, the substrate is cooled, e.g., below −100° C., advantageously below −180° C. (typically with liquid nitrogen), to slow mobility of the carbon and fluorine atoms upon their impact on the substrate. Reducing the atoms' mobility inhibits the atoms from arranging themselves in an ordered manner, thereby providing increased porosity. It is also possible to introduce porosity by trapping noble gas atoms such as Ar in the layer, and then annealing the atoms from the layer. Such noble atom trapping is typically achieved in a bias sputtering mode (discussed below), in which the atoms arriving at the surface of the growing layer have sufficiently high energy to penetrate the layer and become trapped. Annealing to remove the atoms is typically performed in a vacuum at temperatures of about 100 to about 400° C.

Figure 5:
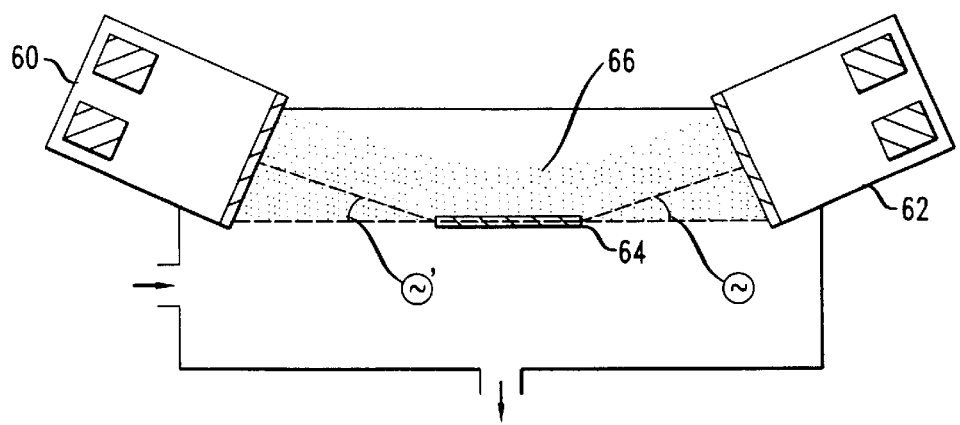
FIG. 5 is a schematic diagram of a sputtering apparatus utilizing two sources, in which the sources are arranged to increase porosity of the substrate.

Alternatively, as reflected in FIG. 5, the targets 60, 62 are arranged at oblique angles θ, θ' to the substrate 64 such that surface features on the substrate 64, e.g., local surface protrusion of a grain structure, essentially block some of the atoms, thereby inhibiting orderly arrangement of the impacting atoms and creating porosity. Advantageously, this oblique angle θ, θ' (referred to herein as the target angle) is less than about 20°, more advantageously less than about 10°, to provide such porosity. (The target angle is determined by the intersection of best-fit line of the substrate surface and the normal to the best fit line of the target surface.) It is also possible to arrange a single target at a oblique angle.

To obtain a combination of desirable properties, the above process is performed such that fluorine is present in the final layer an amount ranging from 20 to 60 at. %, advantageously 30 to 50 at. %, with less than 10 at. % hydrogen, advantageously less than 5 at. % hydrogen, more advantageously less than 1 at. % hydrogen. The combination of properties desired will vary depending on the particular use of the a-C:F layer. More than about 60 at. % fluorine is generally undesirable.

The a-C:F formed by the process of the invention is composed of a mixture of $sp^3$ (C—C) bonded carbon (as found in diamond) and $sp^2$ (C=C) bonded carbon (as found in graphite), and $sp^1$ bonded carbon (a carbyne structure) with the amount of $sp^3$ bonded carbon advantageously about 5 to about 10%, relative to all the carbon bonds in the material. (The bonds are generally monitored using Raman spectroscopy or nuclear magnetic resonance (NMR) techniques.) The $sp^3$ carbon tends to improve both the mechanical strength and thermal stability of the deposited layers, because the three dimensional C—C cross-linked network (e.g., diamond) is more stable than a material containing primarily $sp^2$ and/or $sp^1$ bonds, which tend to form weaker structures. To increase the concentration of $sp^3$ carbon in the layers, it is useful to increase the energy of the ions bombarding the substrate surface. It is possible to achieve this effect by applying a negative dc or rf bias to the substrate. During deposition, the bias accelerates the sputtering gas ions to the substrate, such that the energetic ions cause atoms of the relatively weaker bonded structures to be preferentially sputtered off, thus increasing the relative amount of $sp^3$ bonded carbon in the sputtered layer. (This process is known as bias sputtering or re-sputtering.) As a result of the bias sputtering, an a-C:F layer formed according to the invention will tend to exhibit improved mechanical and thermal properties. Bias sputtering also removes overhang from feature edges and creates shadow-free deposition, thus better allowing the filling of narrow gaps. In addition, the independent bias applied to the substrate provides an additional adjustable parameter for controlling the layer's properties. It is further possible to enhance the ionization of sputtered species (which are largely neutral) in the plasma by inductively coupling independent rf power into the plasma. A strong electric field or bias voltage is thereby created in the plasma sheath layer, accelerating the carbon- and fluorine-containing ions in a direction substantially perpendicular to the substrate surface. The degree of ionization of sputtered species is optionally increased by operating at relatively high pressure (>10 mtorr) to increase the number of collisions between the sputtered species and the background (i.e., plasma) gas. High ion density of sputtered species in the plasma typically improves the effect of bias sputtering.

It is also possible to perform ion beam-assisted sputtering to similarly increase the concentration of $sp^3$ bonded carbon. Specifically, an ion beam, typically of Ar or other inert gas ions (e.g., Kr, Xe), and of an energy typically ranging from 100 to 1000 eV, is directed at the substrate, the ions impacting the substrate such that atoms of $sp^1$ and $sp^2$ bonded carbon structures are preferentially sputtered off, increasing the relative amount of the stronger $sp^3$ bonded carbon network in the sputtered layer.

In another embodiment of the invention, instead of creating a plasma in the area of the target material to sputter the desired source atoms, an ion beam is directed at the target. In such so-called ion beam sputtering, energetic ions, typically inert gases such as $Ar^+$, $Kr^+$, or $Xe^+$ are generated from a conventional ion source (e.g., Penning ion source, Kaufman ion source, or duoplasmatron source). See, e.g., J. Harper, "Ion Beam Deposition" (Ch. II-5), *Thin Film Processes*, J. Vossen et al., eds., Academic Press, 1978, the disclosure of which is hereby incorporated by reference. The ions are extracted and directed at the solid carbon- and fluorine-containing target or targets discussed previously. The carbon and fluorine are sputtered off the targets, and deposited onto a substrate as in the previous embodiment. Ion beam sputtering typically operates at a lower background pressure (e.g., $10^{-5}$ to $10^{-4}$ torr) than magnetron sputtering, the lower pressure generally reducing pinholes in the generated a-C:F layers, as well as reducing particle generation and contamination in the sputtering chamber. The lower pressure also provides an environment in which the species arriving at the substrate surface are more energetic, due to reduced scattering within the sputtering chamber. Such energetic ions typically have sufficient mobility to overcome the energy barrier required for sp$^3$ bonding, and thereby provide an increased level of three-dimensional C—C network structure. Also, in ion beam sputtering, the substrate is substantially isolated from the interaction of the ions and the target, and the ion beam density and current density are therefore able to be controlled substantially independently of, for example, the substrate temperature, gas pressure, angle of deposition, and other process parameters. In addition, the ion beam exhibits a narrow energy spread, which allows better control and modification of the process. To enhance the concentration of sp$^3$ bonded carbon, it is possible to simultaneously bombard the substrate with an ion source, typically an inert gas, such that weaker bonded carbon atoms are preferentially sputtered off (referred to as dual ion beam sputtering).

Figure 8:
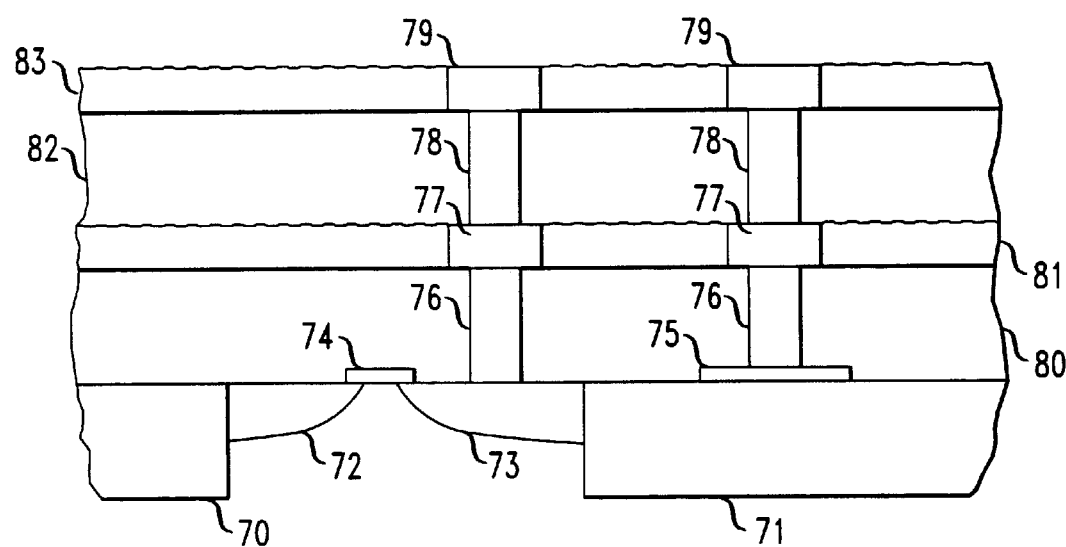
FIG. 8 illustrates a partial device structure incorporating amorphous fluorinated carbon layers, according to the invention.

The a-C:F layers of the invention are useful as a low dielectric constant material in a variety of integrated circuit applications, including damascene and dual damascene structures, as discussed above. It is possible to substitute the a-C:F for presently-used insulating materials, e.g., silicon dioxide or nitrides, or to use the a-C:F in combination with other low dielectric constant materials. In the device structure shown in FIG. 8, for example, it is possible for layers 80, 81, 82, and 83 to be formed from a composite of a-C:F and an organic polymer-based material, such as benzocyclobutane, or an inorganic material such as hydrogen silsequioxane. Suitable device structures will be apparent to those skilled in the art from the description provided herein.

EXAMPLE 1 a-C:F layers were deposited at room temperature by a co-sputtering process from a graphite target (dc mode) and a Teflon target (rf mode), using Ar as the sputtering gas that formed the plasma. The base pressure of the system was 3×10$^{-7}$ Torr, and the sputtering pressure was 3.7 mTorr at an Ar flow rate of 15 sccm. The input dc power to the carbon target was 350 W, and the rf power to the Teflon target was 80 W. The substrate temperature was 62° C., and the deposition time was 60 minutes. The thickness of the layer was measured to be 500 nm from a Dektek surface profiler. The average growth rate of the layer was 8 nm/min. The substrates used were Si, glass, 600 Å TiN on Si, and 3000 Å Al on Si, and the substrates were placed on a rotating stage during the sputtering. The deposited a-C:F layers on both TiN/Si and Al/Si substrates were further sputter-deposited with a 200 nm thick layer of Al through a shadow mask to create a metal-insulator-metal (MIM) structure for out-of-plane dielectric constant (κ) measurement, as well as leakage current and breakdown field measurements.

At 1 MHz, the dielectric constant of the layers was measured via capacitance to be 2.88 (the average for the TiN/Si and Al/Si substrates).

The chemical composition of the layer was measured by XPS (x-ray photoelectron spectroscopy). Except for a slight amount of oxygen (<1 atomic %) no elements were detected other than fluorine and carbon. The fluorine concentration was about 36 atomic %. The XPS spectra showed C—F, C—F$_2$ and C—F$_3$ features in addition to the C—C features. The adhesion strength was qualitatively tested by pulling scotch tape placed on the layers. Layers deposited on silicon and glass showed better adhesion compared to adhesion on the Al/Si and TiN/Si substrates. The average density of the layers deposited on the substrates was about 1.62 g/cm$^3$.

The stress of the deposited layer on Si was measured by a scanning laser system that detects the change of curvature induced in the substrate due to the deposited film. The stress was found to be compressive stress and measured 27 MPa. The weight loss incurred at 450° C. for 15 minutes in N$_2$ was measured in a thermal gravimetric analysis apparatus. The weight loss for the layer deposited on Si was about 8%. The average leakage current for the layers deposited onto the TiN/Si and Al/Si substrates at 1 MV/cm for this example was about 0.56 nA/mm$^2$, and the average breakdown field was greater than 2 MV/cm. The bandgap, as measured by photoluminescence, was about 2.26 eV on the silicon substrate.

EXAMPLE 2 a-C:F layers were deposited at room temperature from a Teflon target, using Ar as the sputtering gas to form the plasma, on the same four types of substrates as Example 1. The base pressure of the sputtering system was about 2×10$^{-7}$ Torr, and the sputtering pressure was about 3 mTorr at an Ar flow rate of about 15 sccm. The input rf power was 100 W with a bias on the target about −20V. The substrate temperature was about 40° C., and the deposition time was about 70 minutes. The average thickness of the layers was measured to be 350 nm from a Dektek surface profiler. The average growth rate of the layers was about 5 nm/min. The deposited a-C:F layers on both TiN/Si and Al/Si substrates were further sputter-deposited with a layer of Al through a shadow mask to create a metal-insulator-metal (MIM) structure for out-of-plane dielectric constant (κ) measurement, and the leakage current and breakdown field measurements.

At 1 MHz, the average dielectric constant of the layers on TiN/Si and Al/Si was measured via capacitance to be 2.08.

The chemical composition of the layer was measured by XPS. Except for a slight amount of oxygen (<1 atomic %), no elements were detected other than fluorine and carbon. The fluorine concentration in the layers was about 58 atomic %. The XPS spectra showed C—F, C—F$_2$ and C—F$_3$ features in addition to the C—C features. The adhesion strength was qualitatively tested by pulling scotch tape from the layers. Layers deposited on all four substrates showed good adhesion with no indication of delamination or cracking. The average density of the deposited layers was about 1.64 g/cm$^3$.

The stress in the layer deposited on Si was found to be a compressive stress at about 5 MPa. The weight loss, measured as in Example 1, was 85% due to high fluorine concentration. The leakage current at 0.3 MV/cm was 2 nA/mm$^2$, and the breakdown field was about 0.5 MV/cm. The bandgap, as measured by luminescence spectra on the silicon substrate, was about 2 eV.

EXAMPLES 3–5 a-C:F layers were sputter deposited on same four substrates as in Examples 1 and 2, under the following conditions. Ar was used as the sputtering gas. The base pressure of the sputtering system was about 3×10$^{-7}$ Torr, and the sputtering pressure was about 3 mTorr at an Ar flow rate of about 15 sccm. The substrate temperature was about 40 to 60° C., and the deposition time was about 60 to 90 minutes.

Example 3: a graphite target having an input dc power of 350 W and a Teflon target having an input rf power of 50 W, resulting in a fluorine concentration of about 22 to 24 at. %. The average layer thickness was about 3315 Å.

Example 4: a graphite target having an input dc power of 350 W and a Teflon target having an input rf power of 70 W, resulting in a fluorine concentration of about 31 at. %. The average layer thickness was about 4970 Å.

Example 5: a graphite target having an input dc power of 350 W and a Teflon target having an input rf power of 100 W, resulting in a fluorine concentration of about 45 at. %. The average layer thickness was about 6000 Å.

Figure 6:
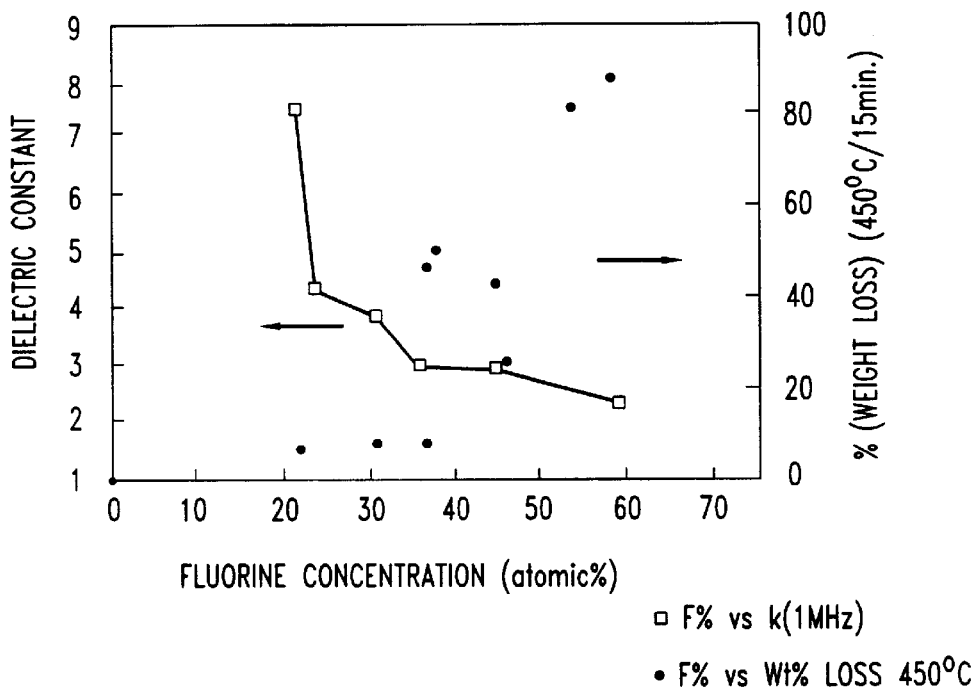
FIG. 6 illustrates the dielectric constant and thermal properties of amorphous fluorinated carbon layers formed in accordance with the invention.
Figure 7:
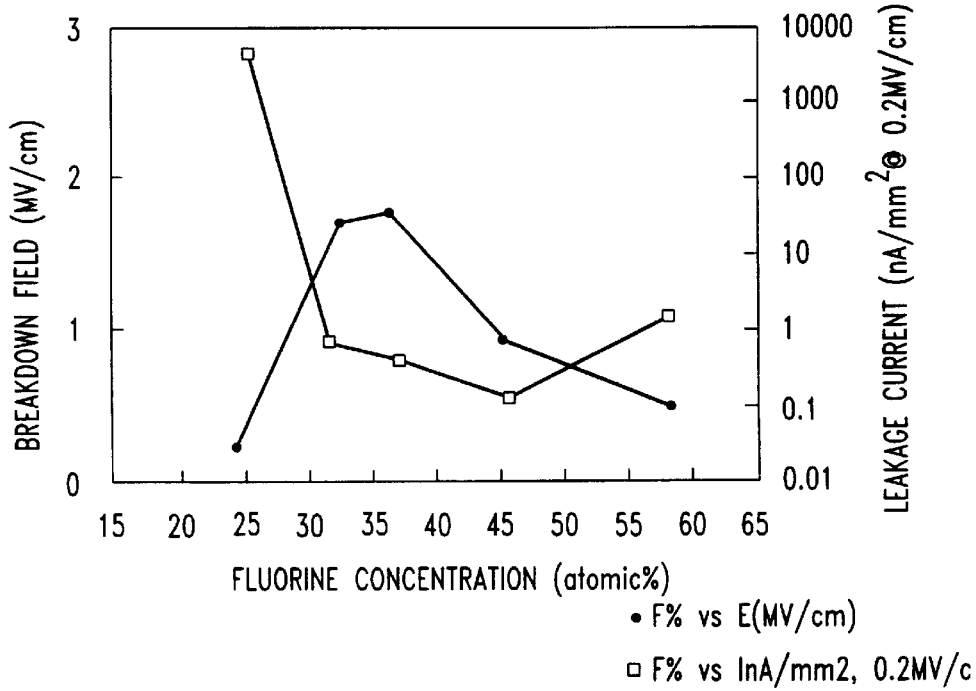
FIG. 7 illustrates the breakdown field and the leakage current of amorphous fluorinated carbon layers formed in accordance with the invention.

The dielectric constant (the average of the layers sputtered onto TiN/Si and Al/Si) and relative thermal stability (of the layers sputtered onto Si) for Examples 1–5 are shown in FIG. 6, as a function of fluorine concentration. The average breakdown field and leakage current of the layers sputtered onto TiN/Si and Al/Si in examples 1–5 are shown in FIG. 7, as a function of fluorine concentration. (all measurements were performed as described in the previous examples.)

What is claimed is:

1. A process for forming a device, comprising the step of: depositing on a substrate an amorphous fluorinated carbon layer by sputter deposition, the sputter deposition utilizing at least one solid target in the absence of intentionally-added gaseous fluorine-containing, gaseous carbon-containing, or gaseous hydrogen-containing sources,
wherein the substrate is cooled to less than −100° C. during the deposition or the at least one solid target is arranged to provide an oblique target angle of about 20° or less with respect to the surface of the substrate, such that the layer comprises at least 10 volume percent porosity, and
wherein the layer comprises 20 to 60 atomic percent fluorine, comprises less than 10 atomic percent hydrogen, exhibits a dielectric constant of 3.0 or less at 1 MHz and room temperature, and is thermally stable up to at least 350° C.

2. The process of claim 1, wherein the layer exhibits a stress of about 100 MPa or less, in absolute value.

3. The process of claim 1, wherein the sputter deposition utilizes a solid carbon-containing target and a solid fluorine-containing target or a single fluoropolymer target.

4. The process of claim 3, wherein the sputter deposition utilizes a solid carbon-containing target and a solid fluorine-containing target, and wherein a plasma is utilized to perform the sputter-deposition, a dc or rf power of about 1 kW or greater is applied to the carbon-containing target, and an rf power of about 1 kW or less is applied to the fluorine-containing target.

5. The process of claim 4, wherein the plasma is selected from an Ar, Kr, and Xe plasma.

6. The process of claim 3, wherein the sputter deposition utilizes a single fluoropolymer target, and wherein a plasma is utilized to perform the sputter deposition, and an rf power of about 1 kW or less is applied to the fluoropolymer target.

7. The process of claim 1, wherein the dielectric constant is 2.5 or less.

8. The process of claim 1, wherein the layer comprises 30 to 50 atomic percent fluorine.

9. The process of claim 1, wherein the layer comprises less than 5 atomic percent hydrogen.

10. The process of claim 9, wherein the layer comprises less than 1 atomic percent hydrogen.

11. The process of claim 1, wherein the layer is thermally stable up to at least 400° C.

12. The process of claim 11, wherein the layer is thermally stable up to at least 450° C.

13. The process of claim 1, wherein an ion beam is directed at the at least one solid target to perform the sputter deposition.

14. The process of claim 1, wherein a plasma is utilized to perform the sputter deposition, and an ion beam is directed at the layer during sputter deposition.

15. The process of claim 1, wherein a plasma is utilized to perform the sputter deposition, and rf power is provided to the plasma independent of power provided to the at least one target.

16. The process of claim 1, wherein about 5 to about 10% of carbon—carbon bonds in the layer are $sp^3$ bonds.

17. A process for forming a device, comprising the steps of:
depositing on a substrate an amorphous fluorinated carbon layer by a sputter deposition technique, wherein the deposition utilizes at least one solid target in the absence of intentionally-added gaseous fluorine-containing, gaseous carbon-containing, or gaseous hydrogen-containing sources, wherein the deposition utilizes a plasma provided by a plasma gas comprising at least one element selected from the group consisting of Ar, Kr, and Xe, and wherein the deposition utilizes a bias applied to the substrate, such that atoms of the plasma gas are trapped in the layer during deposition; and
annealing the deposited layer to remove at least a portion of the trapped atoms to produce a porosity in the layer, wherein the annealed layer comprises 20 to 60 atomic percent fluorine, comprises less than 10 atomic percent hydrogen, exhibits a dielectric constant of 3.0 or less at 1 MHz and room temperature, and is thermally stable up to at least 350° C.

18. The process of claim 17, wherein the annealed layer exhibits a stress of about 100 MPa or less, in absolute value.

19. The process of claim 17, wherein the sputter deposition utilizes a solid carbon-containing target and a solid fluorine-containing target, or a single fluoropolymer target.

20. The process of claim 19, wherein the sputter deposition utilizes a solid carbon-containing target and a solid fluorine-containing target, and wherein a plasma is utilized to perform the sputter deposition, a dc or rf power of about 1 kW or greater is applied to the carbon-containing target, and an rf power of about 1 kW or less is applied to the fluorine-containing target.

21. The process of claim 19, wherein the sputter deposition utilizes a single fluoropolymer target, and wherein a plasma is utilized to perform the sputter deposition, and an rf power of about 1 kW or less is applied to the fluoropolymer target.

22. The process of claim 17, wherein the dielectric constant is 2.5 or less.

23. The process of claims 17, wherein the annealed layer comprises 30 to 50 atomic percent fluorine.

24. The process of claim 17, wherein the annealed layer comprises less than 5 atomic percent hydrogen.

25. The process of claim 24, wherein the annealed layer comprises less than 1 atomic percent hydrogen.

26. The process of claim 17, wherein the annealed layer is thermally stable up to at least 400° C.

27. The process of claim 26, wherein the annealed layer is thermally stable up to at least 450° C.

28. The process of claim 17, wherein an ion beam is directed at the at least one solid target to perform the sputter deposition.

29. The process of claim 17, wherein a plasma is utilized to perform the sputter deposition, and an ion beam is directed at the layer during sputter deposition.

30. The process of claim 17, wherein a plasma is utilized to perform the sputtering, and rf power is provided to the plasma independent of power provided to the at least one target.

31. The process of claim 17, wherein about 5 to about 10% of carbon—carbon bonds in the annealed layer are $sp^3$ bonds.

32. The process of claim 17, wherein the porosity is at least 10 volume percent.

* * * * *